United States Patent [19]

Akiyama et al.

[11] Patent Number: 5,610,737
[45] Date of Patent: Mar. 11, 1997

[54] THIN FILM TRANSISTOR WITH SOURCE AND DRAIN REGIONS HAVING TWO SEMICONDUCTOR LAYERS, ONE BEING FINE CRYSTALLINE SILICON

[75] Inventors: Masahiko Akiyama; Toshiya Kiyota, both of Tokyo; Yoshimi Ikeda, Yokohama, all of Japan

[73] Assignee: Kabushiki Kaisha Toshiba, Kanagawa-ken, Japan

[21] Appl. No.: 399,026

[22] Filed: Mar. 6, 1995

[30] Foreign Application Priority Data

Mar. 7, 1994 [JP] Japan .................................. 6-035140
Jan. 20, 1995 [JP] Japan .................................. 7-007246

[51] Int. Cl.⁶ .............................. G02F 1/136; H01L 29/04
[52] U.S. Cl. ................................ 349/47; 257/57; 349/43
[58] Field of Search ................................ 359/59; 257/57, 257/66, 61, 59

[56] References Cited

U.S. PATENT DOCUMENTS

| 4,804,605 | 2/1989 | Yoshizawa et al. ............... 430/57 |
| 5,477,578 | 1/1993 | Kakinoki et al. ............... 257/64 |

FOREIGN PATENT DOCUMENTS

| 63-36574 | 2/1988 | Japan . |
| 1-183854 | 7/1989 | Japan . |
| 2-277245 | 11/1990 | Japan . |
| 4-302457 | 10/1992 | Japan . |
| 4-313273 | 11/1992 | Japan . |
| 5-129608 | 5/1993 | Japan . |
| 5-226656 | 9/1993 | Japan . |

OTHER PUBLICATIONS

"17-in.-Diagonal Color TFT-LCDs for Engineering Workstations", Kawai et al. SID 93 Digest, pp. 743-746 (1993).

*Primary Examiner*—Anita Pellman Gross
*Assistant Examiner*—Toan Ton
*Attorney, Agent, or Firm*—Finnegan, Henderson, Farabow, Garrett & Dunner, L.L.P.

[57] ABSTRACT

A TFT includes a channel region provided on a substrate and having on the both sides a pair of source region and a drain region formed of an amorphous semiconductor layer, a gate electrode provided above or below the channel region through a gate insulating layer, and wiring electrodes which contact the source region and the drain region directly or indirectly, and wherein a surface portion of the source region and drain region contacting the wiring electrodes directly or indirectly comprises a semiconductor layer containing crystalline structure. By this structure, a thin film transistor can be obtained capable of operating at high speed with high drive capability.

21 Claims, 4 Drawing Sheets

THIN FILM TRANSISTOR WITH SOURCE AND DRAIN REGIONS HAVING TWO SEMICONDUCTOR LAYERS, ONE BEING FINE CRYSTALLINE SILICON

BACKGROUND OF THE INVENTION

1. Field of the Invention

The present invention relates to a thin film transistor (to be referred to as "TFT" hereinafter) and a liquid crystal display device (to be referred to as "LCD" hereinafter) using it.

2. Description of the Related Art

Recently, an LCD is widely used for a wordprocessor, a personal computer, a projection type TV, a small TV or the like. Among the LCDs for these devices, the development of an active matrix type of LCD using a TFT is expected which has less crosstalk and a contrast ratio of more than 100 and in which image quality as good as a CRT can be obtained in moving picture display. The problems of the LCD to be improved from now are the further improvement of image quality, the increase of the number of pixels, and the expansion of size.

For solving these problems it is efficient to improve the performance of TFT. Specifically, in the self-alignment type of TFT, great development is expected to be achieved. The feature of the self-alignment type of TFT is in that a large size of display can be formed uniformly with a low mask alignment precision and the overlapping of a gate and a source or drain can be made small so that a capacitance between electrodes can be also made small. Further, since channel length can be made short, it is possible to increase the turn-on current of TFT.

FIG. 9 is a cross sectional diagram showing a self-alignment type of TFT disclosed in Japanese Patent Laid-Open Application No. Hei-1-(1989)-183854.

As shown in FIG. 9, a gate electrode 2 is formed on a glass substrate 1, and a gate insulating layer 3 is deposited thereon. Further, an amorphous silicon (to be referred to as "a-Si" hereinafter) layer 4 is formed at the position corresponding to the gate electrode 2 thereon as a channel region. An $n^+$-type a-Si layer 7 is provided at both sides of the a-Si layer 4. A silicide layer 9 obtained by reacting metal and silicon is formed on the $n^+$-type a-Si layer 7, on which source and drain electrodes 10 are formed. A channel protecting layer 6 is formed on the a-Si layer 4.

In the TFT as described above, in order to increase the turn-on current it is effective to shorten the channel length L. This is because the turn-on current increases in inverse proportional to the channel length L if a mobility of carriers is constant at the channel. However, the inventors made it sure from experiment that the actual turn-on current was smaller than a predicted value. Decrease of the mobility makes drive capability of TFT small, so that high speed operation becomes difficult.

As a result of analysis of the cause of the above phenomena by the inventors, it could be found that the turn-on current decreased due to a parasitic resistance in the $n^+$-type a-Si layer 7 of the source and drain regions. Also, it could be found that a contact resistance between the $n^+$-type a-Si layer 7 of the source and drain regions and the silicide layer 9 is specifically high among the parasitic resistance.

SUMMARY OF THE INVENTION

Therefore, an object of the present invention is to provide a TFT capable of operating at a high speed with a high drive capability by reducing the contact resistance between the $n^+$-type a-Si layer 7 of the source and drain regions and the silicide layer 9.

Another object of the present invention is to provide a TFT in which a leakage current can be reduced.

Further another object of the present invention is to provide an LCD having superior contrast and display quality in which LCD a large size of display can be obtained, by using such a TFT.

In order to solve the above problems, the TFT according to the present invention is characterized in that the TFT comprises a channel region provided on a substrate and having on the both sides a pair of source region and a drain region formed of an amorphous semiconductor layer, a gate electrode provided above or below said channel region through a gate insulating layer, and wiring electrodes which contact said source region and said drain region directly or indirectly, and in that a surface portion of said source region and drain region contacting said wiring electrodes directly or indirectly comprises a semiconductor layer containing crystalline structure.

According to the TFT of the present invention, the interface formed in the source and drain regions and contacting the silicide layer is formed of silicon containing crystalline structure. As a result, the conductivity is increased to a great extent so that carriers activate, resulting in small contact resistance. Therefore, it is possible to prevent the turn-on current from decreasing, so that there is no case where the mobility is decreased. Accordingly, the LCD using such a TFT has superior contrast and display quality, so that a large size of LCD can be achieved.

DESCRIPTION OF THE PREFERRED EMBODIMENTS

EMBODIMENT 1

Figure 1:
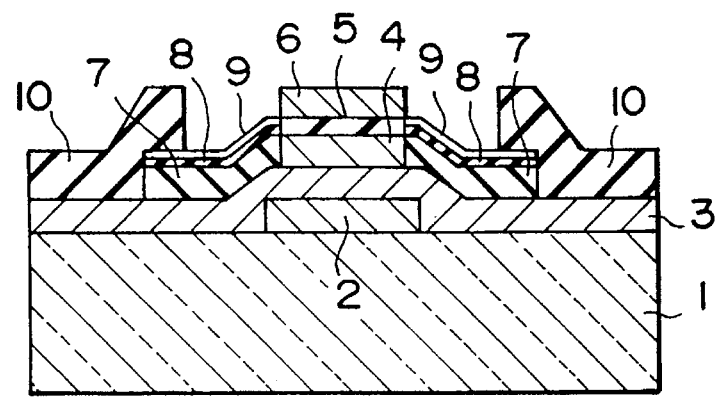
FIG. 1 is a cross sectional view of a TFT according to an embodiment 1 of the present invention.

FIGS. 1, 2, 3A to 3D are diagrams showing a TFT according to the present embodiment. FIG. 1 is a cross sectional view of the TFT when it is cut along the dashed line A-A' in FIG. 2 and FIGS. 3A to 3D are diagrams showing cross sectional views of the TFT in the manufacturing processes. In FIGS. 1, 2, and 3A to 3D, the same components are assigned with the same reference numerals, respectively, and the TFT according to the present invention will be described mainly with reference to FIGS. 3A to 3D.

Figure 3A:
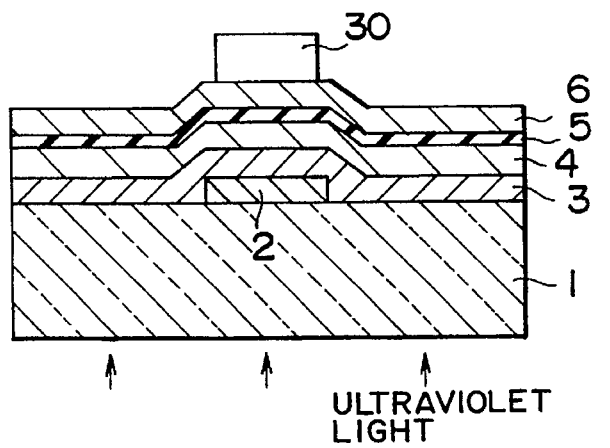
FIG. 3A is a cross sectional view in the manufacturing process of a TFT according to an embodiment 1 of the present invention.

First, as shown in FIG. 3A, a gate electrode 2 made of MoTa alloy is formed on a glass substrate 1 by a magnetron sputtering method or the like. Here, a material which can employ as the gate electrode is metals such as Al, Mo, W, and Ti, a multi layer of any of the metals, or an alloy of the metals, for example. Also, there can be used a layer obtained by patterning a metal such as Al and then by covering the patterned Al with MoTa. An undercoating layer can be formed of an insulating film such as silicon oxide on the glass substrate 1.

Next, by a CVD method there are deposited a gate insulating layer 3 as a multi layer which is composed of a silicon oxide layer of 350 nm in thick and a silicon nitride layer of 50 nm in thick, an a-Si layer 4 of 50 nm in thick on the insulating layer 3, and further a fine crystalline silicon (to be referred to as "μc-Si") layer 5 of 10 nm in thick, and finally a channel protecting layer 6 composed of silicon nitride of 400 nm in thick. Here, the thickness of the a-Si layer 4 can be varied in a range of about 20 to 50 nm, the thickness of the μc-Si layer 5 in a range of about 5 to 20 nm, and further the thickness of the channel protecting layer 6 in a range of about 200 to 500 nm. The condition when the a-Si layer 4 is formed is silane: hydrogen=20:80 with RF power density of 0.03 W/cm$^2$ (a value obtained by dividing the RF power by an electrode area), and the condition when the μc-Si layer 5 is formed is silane: hydrogen=5:95 with RF power density of 0.1 W/cm$^2$. It should be noted that the condition when the μc-Si layer 5 is formed is sufficient if the ratio of hydrogen is more and the RF power is higher than the condition when the a-Si layer 4 is formed. The preferable condition to form the μc-Si layer 5 is silane: hydrogen=1:5 to 1:50 with the RF power density of 0.1 to 4 W/cm$^2$.

The μc-Si formed under such a condition has the structure in which amorphous silicon is present around finely crystallized silicon particles. With a microstructure, it could be considered that $>SiH_2$ is rich at the periphery of fine crystalline particles and gap levels more than in amorphous silicon are produced. For this reason, if a channel region is formed with only the μc-Si layer alone, TFT turn-on current decrease and turn-off current increase. Therefore, the TFT having good characteristics cannot be obtained.

It is preferable that the finely crystallized silicon particles forming the μc-Si have an average grain size in a range of 1 to 20 nm. This is because if the crystalline grain size is too small, a contact resistance does not decrease, while if the grain size is too large, leakage current of the fine crystalline layer becomes too great between the channel region and an upper insulating film.

A volume ratio of the crystallized region in the μc-Si is preferably 1 vol. % or more and less than 100 vol. % and more preferably in a range of 10 to 90 volume %. That is, the μc-Si layer 5 is preferably an amorphous silicon layer containing fine crystalline silicon in the range of 10 to 90 vol. %.

As a method for forming the μc-Si layer 5 mercury sensitivity enhancing photo-CVD method can be used. In this case, it can be formed with a ratio of silane: hydrogen= 20:80. In this case, in order to form the a-Si layer 4, silane of 100% is preferable.

The preferable condition to form the μ-Si layer using mercury sensitivity enhancing photo-CVD method is silane: hydrogen=1:1 to 1:16.

The μc-Si layer 5 can be formed by a discharge decomposition method with micro waves, or a discharge decomposition method with RF waves or micro waves in addition to an applied magnetic field.

Next, a positive type of photoresist is coated, irradiated with ultraviolet light from the back of a substrate to be exposed, and then developed to form a resist pattern 30 having substantially the same width as the gate electrode 2. Here, since the end portion of the channel protecting layer 6 can be determined by a mask exposure along the dashed line B-B' shown in FIG. 2 before the development, the process is employed in the present embodiment. The pattern of channel protecting layer 6 can be formed only with the mask exposure without using the back side exposure. In this case, an alignment margin is required based on mask alignment precision with the gate electrode 2. However, it is sufficiently in practice depending upon application fields.

Figure 3B:
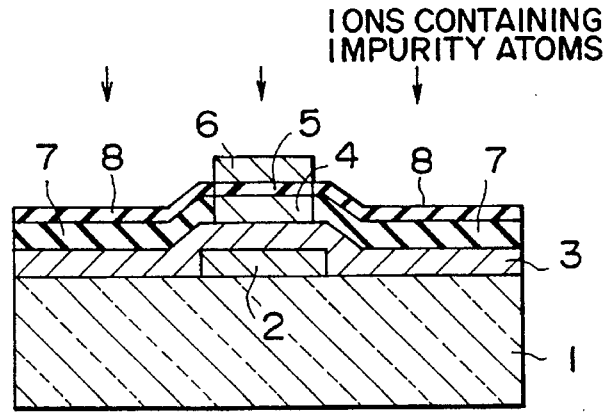
FIG. 3B is a cross sectional view in the manufacturing process of a TFT according to an embodiment 1 of the present invention.

Thereafter, as shown in FIG. 3B, after the channel protecting layer 6 is etched, impurity atoms are doped into the silicon layer. To make n-type semiconductor, impurity atoms such as phosphorus can be used. In place, ions such as $PH_x^+$ can be used. In the present embodiment, ions such as $PH_x^+$ obtained by discharge decomposition of phosphine $PH_3$ gas of 5% diluted with hydrogen gas are accelerated toward the substrate serving the channel protecting layer 6 as a mask. The ratio of dilution ($PH_3/(H_2+PH_3)$) is in a range of 1 to 50%, and preferably in a range of 10 to 50% because hydrogen atoms are entered with a proper ratio. The acceleration voltage was 30 KeV, and the amount of dosed ions is $2\times10^{16}$ ions/cm$^2$. Subsequently, annealing is performed at 230° C. for activation. By this, a n$^+$-type a-Si layer 7 and n$^+$-type μc-Si layer 8 were formed as a source region and a drain region, respectively. The a-Si layer 4 and μc-Si layer 5 under the channel protecting layer 6 is a channel region.

The condition for ion injection can be varied in a range of 1 to 20% with respect to phosphine $PH_3$, in a range of 20 to 40 KeV with respect to the acceleration voltage, and in a range of $1\times10^{15}$ to $1\times10^{17}$ ions/cm$^2$ with respect to the amount of dosed ions. The annealing temperature can be varied in a range of 200° to 300° C.

The ion injection can be performed with the acceleration voltage of 10 to 20 KeV in a range of $1\times10^{15}$ to $1\times10^{16}$ ions/cm$^2$. When shallow doping is performed to the a-Si layer alone, the activation of impurity is not increased. However, this property is good in a case of a multilayer of the ||c-si layer and a-Si layer. For this reason, the upper insulating layer can be made thin, resulting in improvement of manufacturability of TFT. It should be noted that this condition can be combined with ion injection condition of 30 KeV and $1\times10^{15}$ to $4\times10^{16}$ ions/cm$^2$.

The doping method is not limited to the method disclosed here and there can be used a usual ion injection method in which mass separation is performed, or a method in which impurity on the silicon surface is diffused and doped by irradiating a laser beam. In a case of ion injection method, simple mass separation can be used in the temperature of the substrate is heated at 200° to 300° C. in ion irradiation to promote the activation or only hydrogen ions are removed.

Figure 3C:
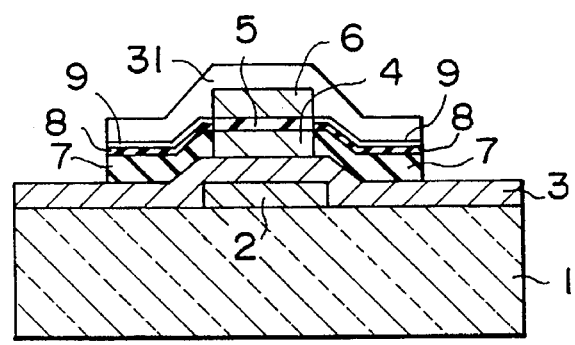
FIG. 3C is a cross sectional view in the manufacturing process of a TFT according to an embodiment 1 of the present invention.

Further, as shown in FIG. 3C, after the silicon surface is cleaned to form silicide on the silicon surface, a layer of Mo 31 is formed by sputtering and patterned. A silicide layer 9 is formed from the patterned layer 31. As a result, semiconductor devices are formed in island manner.

In the present embodiment, Mo was used. However, another metal such as Cr, W, Ti, Pd, Ni, Co and alloy of them can be used.

After the formation of film, annealing can be performed at 200° to 300° C.

Figure 2:
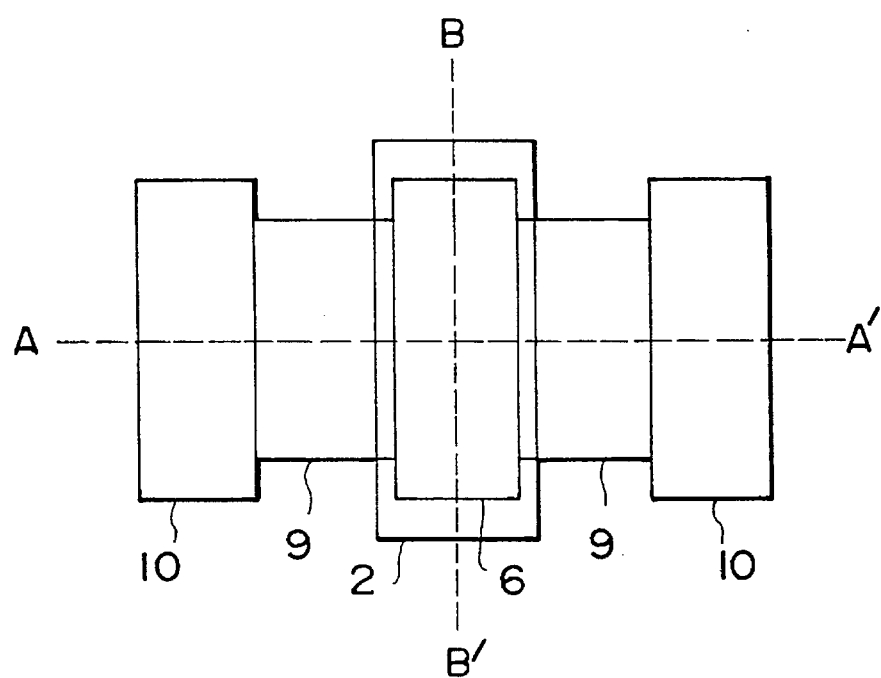
FIG. 2 is a top plan view of a TFT according to an embodiment 1 of the present invention.

In the patterning, in order to form a resist pattern which determines an island shape such that it is narrower than the width of the channel protecting layer 6 in a direction of the dashed line B-B' of FIG. 2, there is employed reactive ion etching (RIE) using gas containing a gas such as chlorine gas having selectivity to the channel protecting layer and the silicon layer. It is possible to etch the channel protecting layer 6 at the same time as the etching.

Figure 3D:
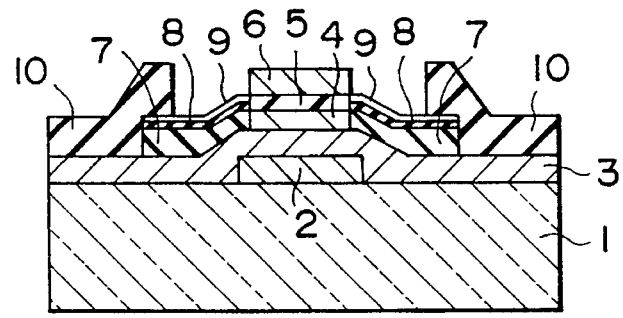
FIG. 3D is a cross sectional view in the manufacturing process of a TFT according to an embodiment 1 of the present invention.

Finally, as shown in FIG. 3D, after Mo is removed which is used for formation of silicide, source and drain electrodes 10 composed of a multi layer of Mo/Al are formed to be connected to the silicide layers 9 which constitute the source and drain regions, respectively. In this manner, a TFT is completed.

A conductive material can be used as material of the electrodes in addition to Mo/Al.

In the TFT obtained in the present embodiment, a contact resistance between the n$^+$-type μc-Si layer 8 and the silicide layer 9 was in a range of $10^{-2}$ to $10^{-4}$ Ωcm$^2$ and was improved by 1 to 3 figures, compared to that of the conventional TFT using a-Si alone.

As a result, the TFT of (channel width W)/(channel length L)=20 μm/5 μm had a mobility of 0.8 cm$^2$/Vs. This value is substantially the same as that of the conventional TFT of the channel length L=12 μm. Therefore, the TFT according to the present embodiment can operate faster about 1.6 time compared to the conventional TFT having the same channel length.

The leakage current was as small as $10^{-12}$ A or below. leakage current is improved by 1 figure, compared to the conventional TFT of the leakage current of $10^{-11}$ A.

This reason could be that the leakage current does not increase even if charges are induced on the channel protecting layer 6 because the silicon layer 5 containing crystalline structure is formed on the opposite side to the gate electrode 2 of the channel region. In the conventional TFT, there are some cases that charges are induced on the channel protecting layer 6. For example, charges are induced by small amount of current flow through the inside or outside of the insulating layer, which is generated by a gate potential, and by the potential which is applied to counter electrode in LCD.

In these cases, carriers are generated to the interface between the channel protecting layer and the a-Si layer because the interface is in good condition. As a result, the leakage current increase.

EMBODIMENT 2

Figure 4:
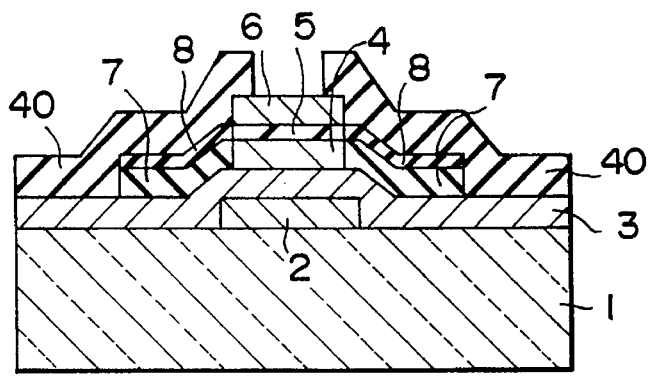
FIG. 4 is a cross sectional view of a TFT according to an embodiment 2 of the present invention.

FIG. 4 is a cross sectional view of the TFT according to the present embodiment. In the figure, the same components are assigned with the same reference numerals. This embodiment is different from the embodiment 1 in the shape of source and drain electrodes.

The manufacturing process are substantially the same as those in the embodiment 1 and only the different processes will be described. After the process shown in FIG. 3B, the semiconductor devices are formed in an island manner and a conductive layer of Mo/Al as an electrode is formed and patterned as the source and drain electrodes 40. In this case, the source and drain electrodes 40 is formed to overlap a part of the channel protecting layer 6.

A transparent material such as ITO can be used as a conductive layer.

In the present embodiment, this conductive layer contact a semiconductor region of the source and drain regions. In this case, the contact resistance between the n$^+$-type μc-si layer 7 and the source and drain electrodes 40 can be also decreased and therefore the same effect as in the embodiment 1 can be obtained.

In the above-mentioned embodiments, the silicon layer as a semiconductor layer was used. However, it is not limited to this but SiGe layer or Ge layer can be used.

Further, in the above embodiments, a MOS type of gate electrode is formed to have the gate insulating layer on the gate electrode. However, a gate electrode structure other than this can be employed such as a Schottky type gate electrode to have a silicon layer on the Schottky metal.

Furthermore, a silicon nitride layer can be formed on the whole of TFT as a passivation film or an organic or inorganic black matrix layer can be formed on the silicon nitride layer for shielding the light. Here, a material such as acrylic resin with an organic pigment contained can be used as a material for the organic black matrix layer.

Fixed charges or interface levels are generated depending upon the formation condition of the passivation film to make small the inclination of the Id—Vgs characteristic in the subthreshold region. However, in the present invention, the good Id—Vgs characteristic can be obtained not depending upon the formation condition of the passivation film because there is μc-Si at the channel region.

In the above-mentioned embodiments, the TFT is formed of n-channel. However, p-channel TFT can be formed.

EMBODIMENT 3

Figure 5:
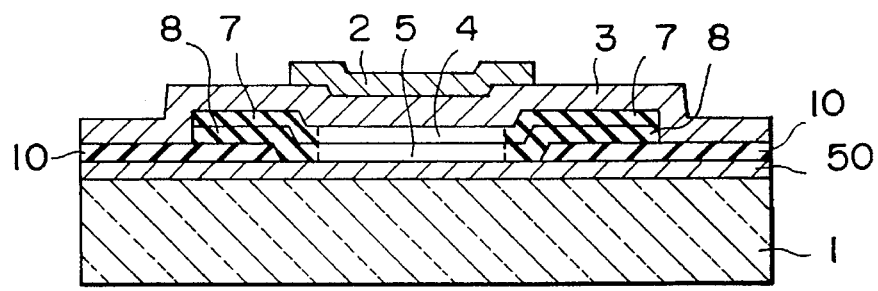
FIG. 5 is a cross sectional view of a TFT according to an embodiment 3 of the present invention.

FIG. 5 is a cross sectional diagram showing the TFT having the stagger structure according to the present embodiment.

The source and drain electrodes 10 are formed on the glass substrate 1 having an insulating layer 50 made of silicon oxide or the like. Next, the μc-Si layer 5 and the a-Si layer 4 is deposited. Phosphorus is selectively injected in a semiconductor region as the source and drain regions so as to form the n$^+$-type a-Si layer 7 and the n$^+$-type μc-Si layer 8. After the gate insulating layer 3 is deposited, the gate electrode 2 is formed to achieve a stagger type of TFT. It should be noted that after the μc-Si layer 5 and the a-Si layer 4 are deposited and then the gate insulating layer 3 is deposited to form the gate electrode 3, the gate insulating layer 3 is etched using the gate electrode as a mask and then impurity can be injected into the source and drain regions. The layer formation condition, layer thickness and impurity injection condition are substantially the same as those in the embodiment 1.

In the obtained TFT the contact resistance between the n$^+$-type μc-Si layer 8 and the source and drain electrodes 10 can be decreased and substantially the same effect can be obtained.

EMBODIMENT 4

Figure 6:
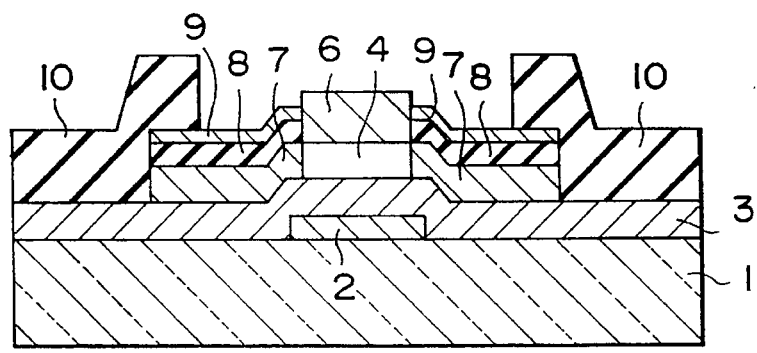
FIG. 6 is a cross sectional view of a TFT according to an embodiment 4 of the present invention.

FIG. 6 is a cross sectional diagram showing the TFT according to the present embodiment. The same components as those in the embodiment 1 are assigned with the same reference numerals. In this embodiment, the present embodiment is different from the embodiment 1 in that the channel region is formed of a-Si alone.

The manufacturing processes are substantially the same as those in the embodiment 1 and therefore only the different processes will be described. The process show in FIG. 3A, the channel protecting layer 6 is formed by a CVD method without forming the µc-Si layer 5 on the a-Si layer 4.

Thereafter, in the process shown in FIG. 3B, the µc-Si layer is selectively formed on the n$^+$-type a-Si layer 7 into which impurity atoms are doped and the doping is performed similarly to the n$^+$-type a-Si layer 7 to form the n$^+$-type µc-Si layer 8. The condition to form selectively the µc-Si layer using mercury sensitive enhancing photo-CVD method is silane: hydrogen=100:1 to 100:5 and the later is etched slightly in CVD apparatus. Subsequently, the same processes as in the embodiment 1 are performed to obtain the TFT. In the present embodiment, the layer formation condition, layer thickness, and impurity injection condition are substantially the same as in the embodiment 1.

The TFT obtained in the present embodiment has the contact resistance in a range of $10^{-2}$ to $10^{-4}$ $\Omega cm^2$ between the n$^+$-type µc-Si layer 8 and the silicide layer 9 which is improved by 1 to 3 figures, compared to the conventional TFT using a-Si alone.

Further, in the present embodiment, the a-Si layer from the n$^+$-type µc-Si layer 8 to the channel region is doped with a high density and therefore the parasitic resistance can be reduced between the channel region 4 and the source and drain regions.

As a result, the TFT of (the channel width W)/(the channel length l)=20 µm/5 µm had a mobility of 0.9 cm$^2$/Vs. This value is 1.2 times greater than the mobility of the conventional TFT having the channel length L of 12 µm. Therefore, the TFT according to the present embodiment can operate 1.7 times faster than the conventional TFT having the same channel length.

Further, the thickness of the n$^+$-type µc-Si layer 8 is 30 nm, like the embodiment 1. If the thickness is made thicker to about 80 nm, the sheet resistance is decreased and there is no parasitic resistance even if the silicide layer 9 is omitted. In addition, substantially the same mobility as in a case that the silicide layer 9 is provided can be obtained.

Furthermore, by improving the layer formation condition and layer forming method, so that the conductivity of the n$^+$-type µc-Si layer 8 is reduced, the silicide layer can be omitted similarly.

In the present embodiment, the n$^+$-type amorphous silicon layer is formed by doping n-type impurity in an amorphous silicon layer but another method can be used.

For example, after an i-type amorphous silicon layer and µc-Si layer are sequentially formed by a CVD method, n$^+$-type µc-Si layer and n$^+$-type a-Si layer can be formed by doping n-type impurity in these silicon layer by ion injection.

In this case, the above two silicon layers and the silicon layer of the channel region can be formed by the same CVD apparatus, resulting in improved productivity.

It should be noted that the n$^+$-type µc-Si layer 8 is formed on the n$^+$-type a-Si layer 7. The reason is as follows.

That is, according to the research by the inventors, a n$^+$-type µc-semiconductor layer is more selectively formed on the n$^+$-type amorphous semiconductor layer than the i-type µc-Si layer is formed on the i-type amorphous semiconductor layer, and crystallization ratio is greater.

In the present embodiment, the silicide layer is formed but it can be omitted. In this case, it is necessary to adjust the resistance of n$^+$-type µc-Si layer 8 and the distance between the source and drain electrodes 10 and the channel protecting layer 6. A smaller resistance of the n$^+$-type µc-Si layer 8 than that of n$^+$-type a-Si layer 7 makes it possible.

EMBODIMENT 5

Figure 7:
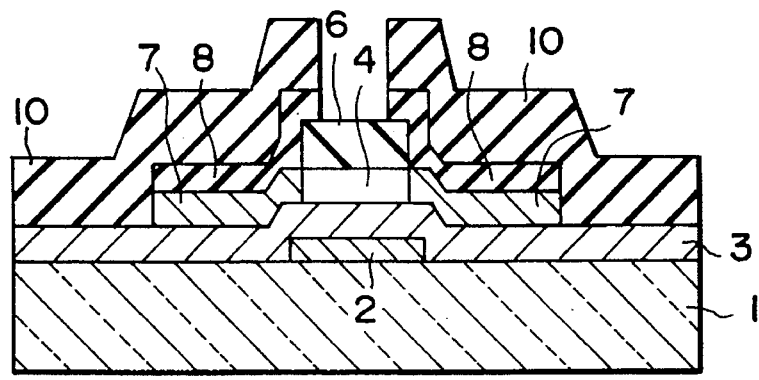
FIG. 7 is a cross sectional view of a TFT according to an embodiment 5 of the present invention.

FIG. 7 is a cross sectional diagram showing the TFT according to the present embodiment. The same components as in the embodiment 1 are assigned with the same reference numerals. In the present embodiment, no silicide layer 9 is provided as wiring and the n$^+$-type µc-Si layer 8 and the source and drain electrodes 10 overlap the channel protecting layer 6.

In the manufacturing processes, the µc-Si layer of 50 nm is formed on the whole surface including the channel protecting layer 6 without selectively forming the µc-Si layer in the method of the embodiment 4 and then the doping is performed like the embodiment 1.

Next, as shown in FIG. 7, after a conductive layer such as a Mo/Al multi layer as the source and drain electrodes 10 is formed on the whole of surface, the conductive layer is patterned to form the source and drain electrodes 10 which overlap a part of the channel protecting layer 6. Subsequently, the µc-Si layer 8 is etched serving the source and drain electrodes 10 as an etching mask such that the n$^+$-type µc-Si layer 8 is selectively formed on the source and drain regions.

In a case of the present embodiment, the source and drain electrodes 10 contact the n$^+$-type µc-Si layer 8 of the source and drain regions not through the silicide layer but directly. In such a case, the contact resistance can be reduced between the n$^+$-type a-Si layer 7 and the source and drain electrode 10 and the similar effect to the embodiment 1 can be obtained.

In the present embodiment, the patterning is performed in an order of source and drain electrodes 10, and n$^+$-type µc-Si layer 8. However, the patterning can be performed in an inverse order. That is, the n$^+$-type µc-S1 layer 8 is first formed on the whole surface. Then, after the n$^+$-type µc-Si layer 8 is patterned into a predetermined shape, the conductive layer is formed on the whole surface which is patterned to form the source and drain electrodes 10.

EMBODIMENT 6

Figure 8:
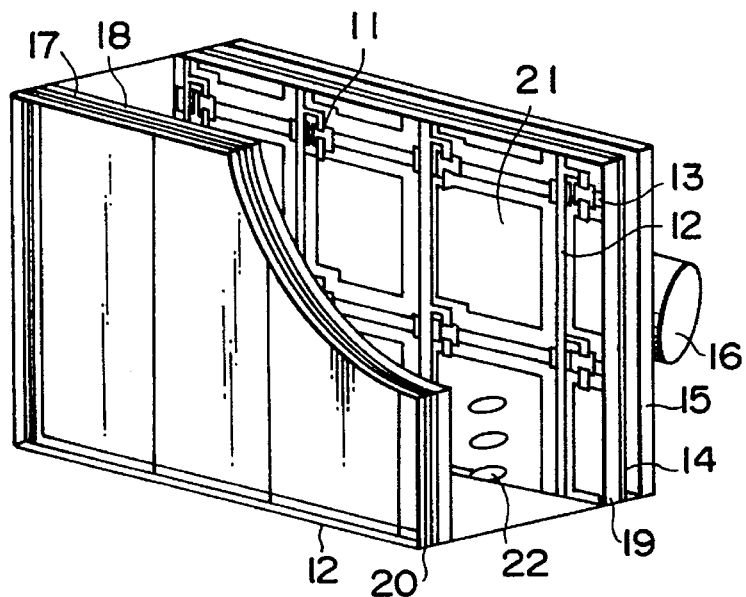
FIG. 8 is a perspective view of an LCD according to the present invention.
Figure 9:
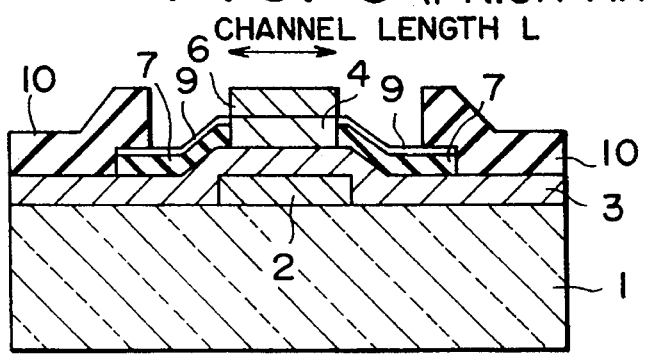
FIG. 9 is a cross sectional view of a conventional TFT.

A liquid crystal display device using a TFT obtained by following the procedure indicated in Embodiment 1 will be described specifically below with reference to FIG. 8.

A plurality of display electrodes 21 are laid out on the surface of a thin-film transistor (TFT) array substrate 19. TFT elements 11 obtained by following the procedure of Embodiment 1 are juxtaposed one each to the display electrodes 21. Further, on the surface of the TFT array substrate 19, a plurality of data lines 12 and address lines 13 are laid out perpendicularly mutually. Either drain electrodes or source electrodes of the TFT elements 11 are connected to the data lines 12 and gate electrodes to the address lines 13. When the liquid crystal display device is of the transmissive type, a backlight 16 is disposed on the reverse side of the TFT array substrate 19 through the medium of a polarizing element 14 and a diffusion plate 15.

On the obverse side of a counter substrate 20, counter electrodes 18 are laid out throughout the entire surface through the medium of color filter layers 17. On the reverse side of the counter substrate 20, polarizing elements 12 are disposed.

The TFT array substrate 19 and the counter substrate 20 are formed of such a transparent material as glass or quartz.

Electroconductive thin films made of such materials as ITO (indium tin oxide) and other similar metallic substances are used as the display electrodes 21 and the counter electrodes 18. In the case of a transmissive type liquid crystal display device, such transparent materials as ITO are used for the two electrodes. In the case of a reflective type liquid crystal display device, it suffices to use a transparent material for electrodes of either of the two types mentioned above. More often than not, the counter electrodes are made of a transparent material. In this case, the liquid crystal display device has no use for the polarizing element 14, the diffusion plate 15, and the backlight 16 which are disposed on the reverse side of the TFT array substrate 19.

Aligning layers are formed one each on the surfaces of the TFT array substrate 19 and the counter substrate 20. A spacer is interposed between the two substrates to fix the interval between the two substrates. This spacer can be a bunch of beads or rods adapted as popularly known to be scattered between opposed surfaces to insert a uniform gap therebetween or a plurality of columnar spacers formed at predetermined positions by superposing a polymer layer on the surface of a substrate and then removing the polymer layer except for the portions falling on the predetermined positions by the photolithographic technique. A liquid crystal composition 22 is sealed in between the orientation layers of the TFT array substrate 19 and the counter substrate 20.

Since the liquid crystal display device is capable of lowering the magnitude of leakage current, it enjoys improved contrast and excels in quality of display.

What is claimed is:

1. A thin film transistor comprising:
   a channel region provided on a substrate with two source regions and two drain regions formed of an amorphous semiconductor layer, one of said two source regions and one of said two drain regions each being positioned on opposite sides of said channel region;
   a gate electrode provided above or below said channel region through a gate insulating layer; and
   wiring electrodes which contact said source region and said drain region directly or indirectly,
   wherein said channel region consists of amorphous silicon, and
   said source regions and said drain regions comprise two semiconductor layers, which are an amorphous silicon layer containing fine crystalline silicon on an upper portion and an amorphous silicon layer on a bottom portion.

2. A thin film transistor according to claim 1, wherein a silicide layer is formed between said source and drain regions and said wiring electrodes.

3. A thin film transistor according to claim 1, wherein said gate electrode is provided through said gate insulating layer above said channel region.

4. A thin transistor according to claim 1, wherein said gate electrode is provided through said gate insulating layer below said channel region.

5. A thin film transistor according to claim 1, wherein said semiconductor layer of said amorphous silicon layer containing fine crystalline silicon comprises fine crystalline silicon having a grain size in a range of 1 to 20 nm.

6. A thin film transistor according to claim 1, wherein said semiconductor layer of said amorphous silicon layer containing fine crystalline silicon comprises fine crystalline silicon equal to, or more than, 1% by volume and less than 100% by volume.

7. A thin film transistor according to claim 1, wherein said semiconductor layer of said amorphous silicon layer contains 10 to 90% fine crystalline silicon by volume.

8. A thin film transistor comprising:
   a channel region provided on a substrate with two source regions and two drain regions formed of an amorphous semiconductor layer, one of said two source regions and one of said two drain regions each being positioned on opposite sides of said channel region;
   a gate electrode provided above or below said channel region through a gate insulating layer; and
   wiring electrodes which contact said source region and said drain region directly or indirectly,
   wherein said channel region consists of two semiconductor layers, one being an amorphous silicon layer containing fine crystalline silicon on an upper portion and the other layer being an amorphous silicon layer on a bottom portion, and
   said source region and said drain region comprise two semiconductor layers, which are an amorphous silicon layer containing fine crystalline silicon on an upper portion and an amorphous silicon layer on a bottom portion.

9. A thin film transistor according to claim 8, wherein a silicide layer is being formed between said source and drain regions and said wiring electrodes.

10. A thin film transistor according to claim 8, wherein said gate electrode is provided through said gate insulating layer above said channel region.

11. A thin film transistor according to claim 8, wherein said gate electrode is provided through said gate insulating layer below said channel region.

12. A thin film transistor according to claim 8, wherein said semiconductor layer of said amorphous silicon layer containing fine crystalline silicon comprises fine crystalline silicon having a grain size in a range of 1 to 20 nm.

13. A thin film transistor according to claim 8, wherein said semiconductor layer of said amorphous silicon layer containing fine crystalline silicon comprises fine crystalline silicon equal to, or more than, 1% by volume and less than 100% by volume.

14. A thin film transistor according to claim 8, wherein said semiconductor layer of said amorphous silicon layer contains 10 to 90% fine crystalline silicon by volume.

15. A thin film transistor comprising:
   a channel region provided on a substrate with two source regions and two drain regions formed of an amorphous semiconductor layer, one of said source regions and one of said drain regions each being positioned on opposite sides of said channel region;
   a gate electrode provided above or below said channel region through a gate insulating layer; and
   wiring electrodes which contact said source region and said drain region directly or indirectly,
   wherein said channel regions, said source regions and said drain regions consist of two semiconductor layers formed in same process, one being an amorphous silicon layer containing fine crystalline silicon on an upper portion and the other being an amorphous silicon layer on a bottom portion.

16. A thin film transistor according to claim 15, wherein a silicide layer is formed between said source and drain regions and said wiring electrodes.

17. A thin film transistor according to claim 15, wherein said gate electrode is provided through said gate insulating layer above said channel region.

18. A thin film transistor according to claim 15, wherein said gate electrode is provided through said gate insulating layer below said channel region.

19. A thin film transistor according to claim 15, wherein said semiconductor layer of said amorphous silicon layer containing fine crystalline silicon comprises fine crystalline silicon having a grain size in a range of 1 to 20 nm.

20. A thin film transistor according to claim 15, wherein said semiconductor layer of said amorphous silicon layer containing fine crystalline silicon comprises fine crystalline silicon equal to, or more than, 1% by volume and less than 100% by volume.

21. A thin film transistor according to claim 15, wherein said semiconductor layer of said amorphous silicon layer contains 10 to 90% fine crystalline silicon by volume.

* * * * *

UNITED STATES PATENT AND TRADEMARK OFFICE
CERTIFICATE OF CORRECTION

PATENT NO. : 5,610,737
DATED : March 11, 1997
INVENTOR(S) : Masahiko AKIYAMA et al.

It is certified that error appears in the above-indentified patent and that said Letters Patent is hereby corrected as shown below:

Claim 8, Column 10, Line 16, "region" (both occurrences) should read --regions--.

Signed and Sealed this

Eighteenth Day of November 1997

Attest:

BRUCE LEHMAN

Attesting Officer

Commissioner of Patents and Trademarks